United States Patent
Hu (10) Patent No.: US 11,309,500 B2
(45) Date of Patent: Apr. 19, 2022

(54) DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Kai Hu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 223 days.

(21) Appl. No.: 16/638,478

(22) PCT Filed: Jan. 8, 2020

(86) PCT No.: PCT/CN2020/070871
§ 371 (c)(1),
(2) Date: Feb. 12, 2020

(87) PCT Pub. No.: WO2021/036164
PCT Pub. Date: Mar. 4, 2021

(65) Prior Publication Data
US 2021/0408405 A1    Dec. 30, 2021

(30) Foreign Application Priority Data
Aug. 23, 2019 (CN) .......................... 201910783550.8

(51) Int. Cl.
*H01L 51/00*  (2006.01)
*H01L 51/56*  (2006.01)
*H01L 27/32*  (2006.01)

(52) U.S. Cl.
CPC .......... *H01L 51/0097* (2013.01); *H01L 51/56* (2013.01); *H01L 27/3276* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 9,887,254 | B2* | 2/2018 | Tang | H01L 27/3267 |
| 2017/0330926 | A1* | 11/2017 | Tang | H01L 27/3267 |
| 2019/0131362 | A1 | 5/2019 | Lee et al. | |
| 2019/0207130 | A1* | 7/2019 | He | H01L 51/003 |
| 2020/0105168 | A1* | 4/2020 | Choi | H01L 51/5253 |
| 2020/0357829 | A1* | 11/2020 | Yang | H01L 29/78675 |
| 2021/0328158 | A1* | 10/2021 | Kang | H01L 51/0097 |

FOREIGN PATENT DOCUMENTS

| | | |
|---|---|---|
| CN | 107315507 | 11/2017 |
| CN | 107742639 | 2/2018 |
| CN | 109256044 | 1/2019 |
| CN | 109659318 | 4/2019 |
| CN | 109727536 | 5/2019 |

* cited by examiner

Primary Examiner — J. E. Schoenholtz (57) ABSTRACT

A display panel and a manufacturing method thereof are provided. The display panel includes a flexible substrate, the flexible substrate includes a bending region and a non-bending region, and a thickness of the flexible substrate in the bending region is less than a thickness of the flexible substrate in the non-bending region.

11 Claims, 8 Drawing Sheets

DISPLAY PANEL AND MANUFACTURING METHOD THEREOF

RELATED APPLICATIONS

This application is a National Phase of PCT Patent Application No. PCT/CN2020/070871 having International filing date of Jan. 8, 2020, which claims the benefit of priority of Chinese Patent Application No. 201910783550.8 filed on Aug. 23, 2019. The contents of the above applications are all incorporated by reference as if fully set forth herein in their entirety.

FIELD AND BACKGROUND OF THE INVENTION

The present application relates to the field of display panel technologies, and in particular, to a display panel and a manufacturing method thereof.

The statements herein merely provide background information related to the present application and do not necessarily constitute conventional art.

With the increase in demand for flexible and foldable smartphones, and the development of foldable displays equipped with tablet computers and wearable electronic devices, the development of flexible foldable display panels has been stimulated. For some high-end display panels, consumers prefer flexible foldable and narrow frame designs. At present, in order to realize foldable and narrow frame designs, most manufacturers use active-matrix organic light-emitting diode (AMOLED) technology based on flexible substrates. The flexible substrate has good flexibility, so it has the premise of being foldable. In addition, it can reduce a frame of original rigid display panel through bonding pads of a chip on film (COF) or bonding pads of a chip on panel (COP) control chip positioned at the frame of the display panel, and downward bending of some metal traces and circuits, thereby achieving a foldable and narrow frame design for the display panels.

However, there are still some unresolved problems when using the flexible substrate as a base material and combined with a downward bending technology to achieve foldable and narrow frame design, such as breakage or peeling of the flexible substrate, which seriously affects the display effect of the display panel. This phenomenon is especially noticeable in a bending region.

SUMMARY OF THE INVENTION

Technical Problem

The present application provides a display panel and a method of manufacturing the same. By reducing a thickness of the flexible substrate in a bending region to reduce the bending stress on the flexible substrate in the bending region during bending, the technical problem that the flexible substrate is prone to break or peel when the flexible substrate in the bending region is bent is solved.

Technical Solutions

To solve the above problems, the technical solutions provided in the present application are as follows.

The present application provides a display panel including a flexible substrate, wherein the flexible substrate includes a bending region and a non-bending region, and a thickness of the flexible substrate positioned in the bending region is less than a thickness of the flexible substrate positioned in the non-bending region.

In the display panel provided in the embodiment of the present application, a first groove is disposed on a surface of the flexible substrate, and the first groove is disposed corresponding to the bending region.

In the display panel provided in the embodiment of the present application, a second groove is disposed on a surface of the flexible substrate away from the first groove, and the second groove is disposed corresponding to the bending region.

In the display panel provided in the embodiment of the present application, a plurality of third grooves are disposed on a surface of the flexible substrate away from the first groove, and the third grooves are disposed corresponding to the bending region.

In the display panel provided in the embodiment of the present application, a plurality of fourth grooves are disposed at a bottom of the first groove.

In the display panel provided in the embodiment of the present application, a plurality of fourth grooves are disposed at a bottom of the first groove, and a plurality of fifth grooves are disposed at a bottom of the second groove.

In the display panel provided in the embodiment of the present application, the flexible substrate includes a first flexible layer, and an intermediate layer and a second flexible layer are sequentially disposed on the first flexible layer; and the first groove is disposed on a surface of the first flexible layer away from the intermediate layer, and the second groove is disposed on a surface of the second flexible layer away from the intermediate layer.

In the display panel provided in the embodiment of the present application, a plurality of fourth grooves are disposed at a bottom of the first groove, and a plurality of fifth grooves are disposed at a bottom of the second groove.

In the display panel provided in the embodiment of the present application, the non-bending region includes a first region and a second region, and the first region and the second region are connected to each other by the bending region; wherein the display panel further includes a thin film transistor (TFT) array layer, an organic light-emitting layer, and an encapsulation layer sequentially disposed on the flexible substrate positioned in the first region, a metal layer disposed on the flexible substrate positioned in the bending region, and a driving circuit disposed on the flexible substrate positioned in the second region; and wherein the metal layer extends from the TFT array layer to the driving circuit.

In the display panel provided in the embodiment of the present application, the flexible substrate positioned in the bending region is bent to an angle of 180° in a direction away from the TFT array layer; wherein the display panel further includes a support layer, the support layer is positioned on a side of the flexible substrate away from the TFT array layer, and the flexible substrate positioned in the first region and the flexible substrate positioned in the second region are connected and fixed by the support layer.

In the display panel provided in the embodiment of the present application, the first region includes a display region and a first transition region, and the second region includes a second transition region and a third region; wherein the display region and the bending region are connected through the first transition region, the third region and the bending region are connected through the second transition region; the first transition region corresponds to the second transition region, the third region corresponds to the display region; and the TFT array layer, the organic light-emitting layer, and the support layer are disposed corresponding to the display region.

An embodiment of the present application further provides a display panel including a flexible substrate, wherein the flexible substrate includes a first flexible layer, and an intermediate layer and a second flexible layer sequentially disposed on the first flexible layer; and wherein the flexible substrate includes a bending region and a non-bending region, and a thickness of the flexible substrate in the bending region is less than a thickness of the flexible substrate in the non-bending region.

An embodiment of the present application further provides a method of manufacturing a display panel, including the following steps:

providing a flexible substrate, wherein the flexible substrate includes a bending region and a non-bending region; and performing a thinning process on the flexible substrate in the bending region so that a thickness of the flexible substrate in the bending region is less than a thickness of the flexible substrate in the non-bending region.

In the method of manufacturing the display panel provided in the embodiment of the present application, performing a thinning process on the flexible substrate in the bending region includes the following steps:

covering a surface of the flexible substrate in the non-bending region with a photoresist layer to expose the flexible substrate in the bending region;

etching the exposed flexible substrate by an etching solution to thin the thickness of the flexible substrate in the bending region; and removing the photoresist layer covered on the flexible substrate.

In the method of manufacturing the display panel provided in the embodiment of the present application, the flexible substrate includes a first flexible layer, and an intermediate layer and a second flexible layer are sequentially disposed on the first flexible layer;

wherein performing a thinning process on the flexible substrate in the bending region includes the following steps:

covering the first flexible layer and a surface of a side of the second flexible layer away from the intermediate layer in the non-bending region with a photoresist layer to expose the first flexible layer and the second flexible layer in the bending region;

etching exposed the first flexible layer and the second flexible layer by an etching solution to thin thicknesses of the first flexible layer and the second flexible layer in the bending region; and removing the photoresist layer covered on the flexible substrate.

Beneficial Effect

The present application reduces the bending stress on the flexible substrate in the bending region by reducing the thickness of the flexible substrate in the bending region, and prevents the flexible substrate in the bending region from being broken or peeled from other adjacent structures in the bending process, thereby ensuring an overall performance of the display panel. The flexible substrate consists of a first flexible layer, and an intermediate layer and a second flexible layer which are sequentially disposed on the first flexible layer. By reducing the thicknesses of the first flexible layer and the second flexible layer, the thickness of the flexible substrate in the bending region is less than the thickness of the flexible substrate in the non-bending region, which can reduce the bending stress of each layer of the structure in the bending region in the bending process. The first flexible layer and the second flexible layer are prevented from being broken or peeled from the intermediate layer in the bending region, thereby ensuring the structural integrity and functional integrity of the flexible substrate, and effectively improving the display effect of the display panel.

BRIEF DESCRIPTION OF THE SEVERAL VIEWS OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DESCRIPTION OF SPECIFIC EMBODIMENTS OF THE INVENTION

The specific structural and functional details disclosed herein are merely representative, and are used to describe exemplary embodiments of the present application. However, this application can be embodied in many alternative forms and should not be construed as being limited to only the embodiments set forth herein.

In the description of the present invention, it is to be understood that the terms such as "center", "longitudinal", "upper", "lower", "left", "right", "vertical", "horizontal", "top", "bottom", "inside", "outside", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention. In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise. In addition, the term "including" and any variations thereof are intended to cover non-exclusive inclusion.

In the description of this application, it should be noted that the terms "installation", "connected", and "coupled" should be understood in a broad sense, unless explicitly stated and limited otherwise. For example, they may be fixed connections, removable connected or integrally connected; it can be mechanical connection or electrical connection; it can be directly connected, or it can be indirectly connected through an intermediate medium, it can be an internal connection of two elements. For those of ordinary skill in the art, the specific meanings of the above terms in this application can be understood according to specific situations. The terminology used herein is merely for the purpose of describing particular embodiments and is not intended to limit the exemplary embodiments. Unless the context clearly indicates otherwise, as used herein, the singular forms "a" and "an" are intended to include the plural. It should also be understood that the terms "including" and/or "including" as used herein specify the existence of stated features, integers, steps, operations, units and/or components, and it does not exclude the presence or addition of one or more other features, integers, steps, operations, units, components, and/or combinations thereof.

The application is further described below with reference to the drawings and embodiments.

Figure 1:
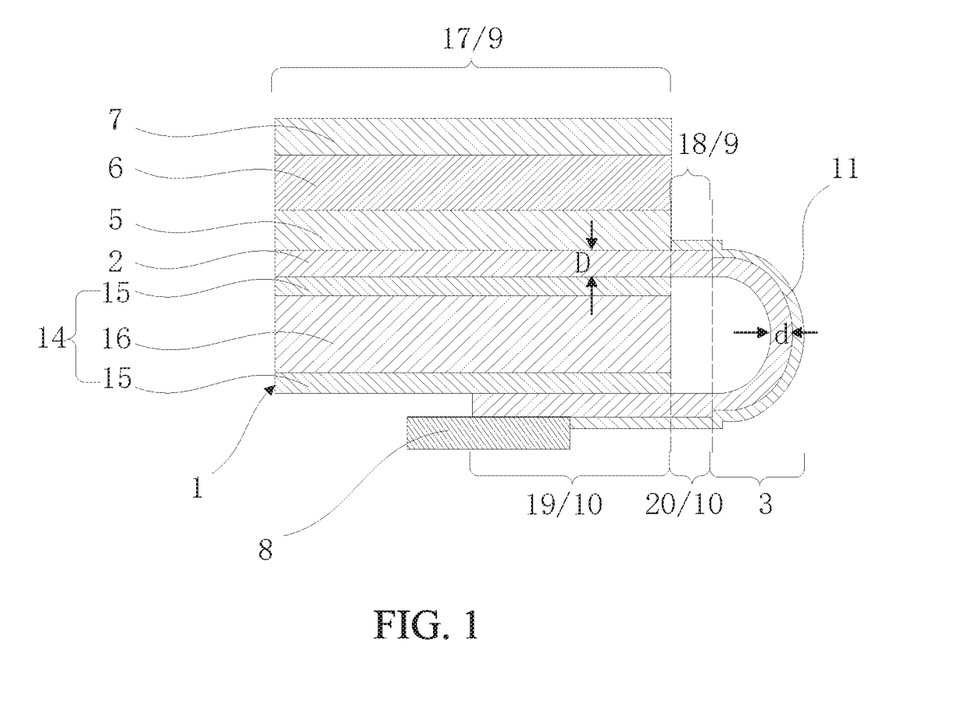
FIG. 1 is a schematic structural diagram of a display panel according to an embodiment of the present application.
Figure 2:
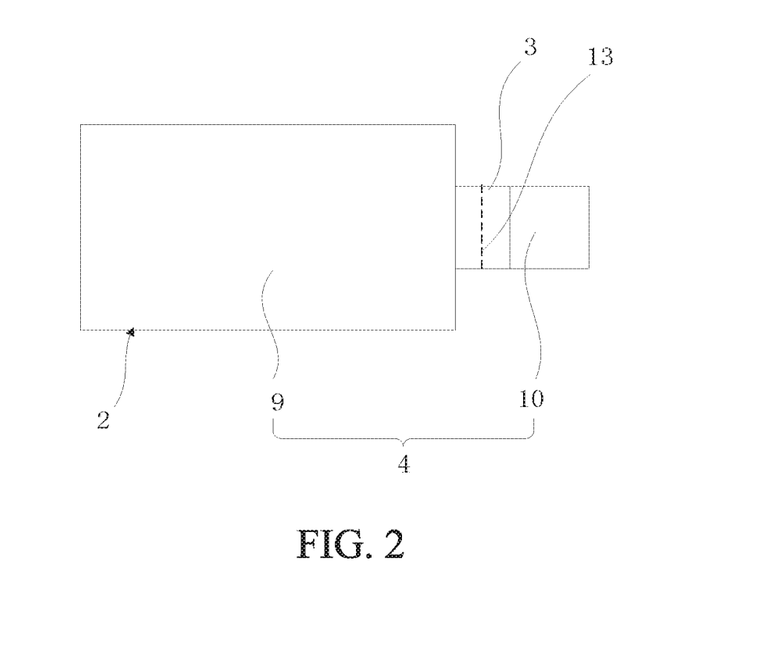
FIG. 2 is a top view of a flexible substrate in an unbent state according to an embodiment of the present application.
Figure 3:
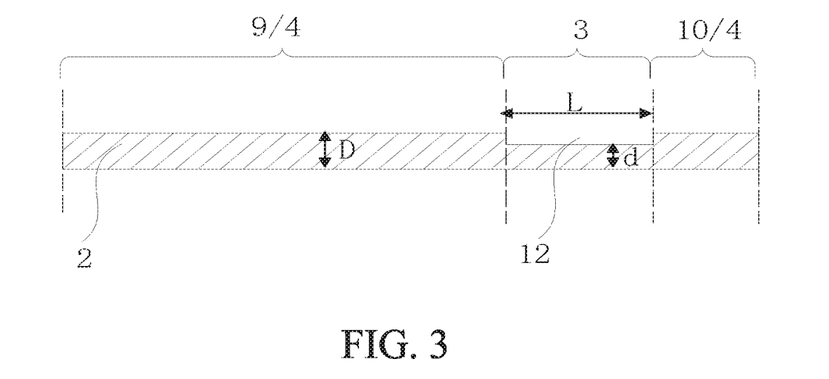
FIG. 3 is a cross-sectional view of the flexible substrate in the unbent state according to an embodiment of the present application.
Figure 4:
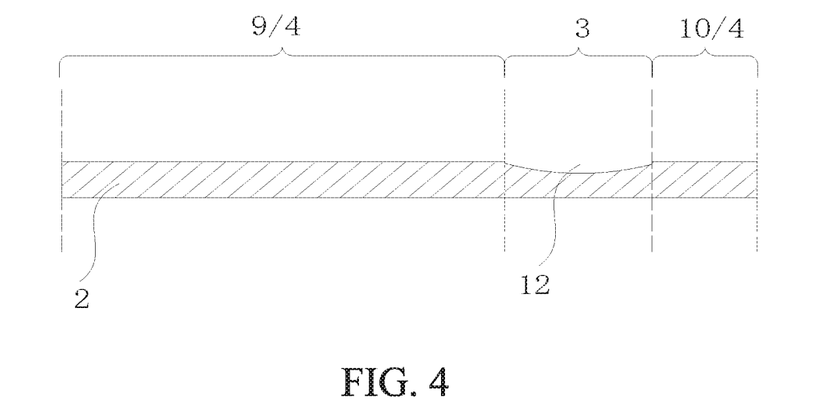
FIG. 4 is a cross-sectional view of another flexible substrate in the unbent state according to an embodiment of the present application.
Figure 5:
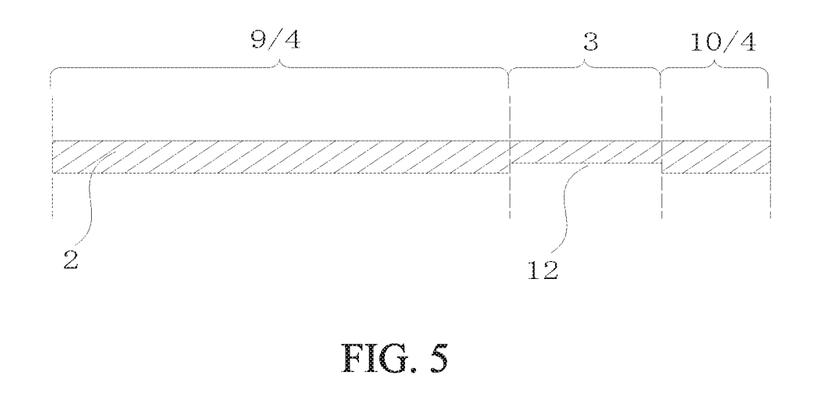
FIG. 5 is a cross-sectional view of yet another flexible substrate in the unbent state according to an embodiment of the present application.

As shown in FIGS. 1 to 3, an embodiment of the present application discloses a display panel 1 including a flexible substrate 2. The flexible substrate 2 includes a bending region 3 and a non-bending region 4, and a thickness (d) of the flexible substrate 2 positioned in the bending region 3 is less than a thickness (D) of the flexible substrate 2 positioned in the non-bending region 4.

Specifically, the display panel 1 further includes a thin film transistor (TFT) array layer 5, an organic light-emitting layer 6, an encapsulation layer 7, and a driving circuit 8 disposed on the flexible substrate 2 positioned in the non-bending region 4. The non-bending region 4 includes a first region 9 and a second region 10, and the first region 9 and the second region 10 are connected to each other by the bending region 3. The TFT array layer 5, the organic light-emitting layer 6, and the encapsulation layer 7 are disposed corresponding to the first region 9, and are sequentially formed on the flexible substrate 2 positioned in the first region 9. The driving circuit 8 is disposed on the flexible substrate 2 positioned in the second region 10. A metal layer 11 is disposed on the flexible substrate 2 positioned in the bending region 3 and extends from the TFT array layer 5 to the driving circuit 8. The TFT array layer 5 and the driving circuit 8 are electrically connected through the metal layer 11.

As shown in FIG. 3, where a length L of the flexible substrate 2 in the bending region 3 is constant, reducing the thickness d of the flexible substrate 2 in the bending region 3 can effectively reduce the bending stress of the flexible substrate 2 in the bending process. In the present embodiment, by reducing the thickness of the flexible substrate 2 in the bending region 3 to reduce the bending stress on the flexible substrate 2 in the bending region 3 during bending, which prevents the flexible substrate 2 in the bending region 3 from being broken or peeled from other adjacent structures in the bending process, thereby ensuring an overall performance of the display panel. In addition, the display panel 1 also includes a bending region which overlaps with the bending region 3 of the flexible substrate 2, reducing the thickness of the flexible substrate 2 in the bending region 3, that is, reducing a thickness of the overall structure in the bending region of the display panel 1. Compared to the scheme that by reducing a thickness of the metal layer 11 or the buffer layer in the bending region of the display panel 1, and a thickness of the overall structure in the bending region of the display panel 1 can be reduced so as to reduce the stress on each layer structure in the bending region of display panel 1. The present application can significantly reduce the overall thickness of the bending region of the display panel 1 without damaging a structure of an effective display region (such as metal wires) of the display panel 1, so that the bending stress on each layer structure positioned in the bending region is reduced, and the flexible substrate 2 and other structural layers positioned in the bending region 3 are prevented from being broken or peeled, thereby improving the display effect of the display panel 1.

In an embodiment, as shown in FIGS. 2 to 5, a first groove 12 is disposed on a surface of a side of the flexible substrate 2, and the first groove 12 is disposed corresponding to the bending region 3. Specifically, when the flexible substrate 2 positioned in the bending region 3 is not bent, an orthographic projection of the first groove 12 on the flexible substrate 2 coincides with an orthographic projection of the bending region 3 on the flexible substrate 2. The first groove 12 can be disposed on an upper surface of the flexible substrate 2, or can be disposed on a lower surface of the flexible substrate 2.

Specifically, a depth of the first groove 12 can be same everywhere or can be changed thereof. For example, the bending region 3 includes a bending line 13, and the depth of the first groove 12 is gradually decreased in a direction perpendicular to the bending line 13 and away from the bending line 13. The bending line 13 cab refer to a position of a center line having a minimum radius of curvature after the bending region 3 is bent.

In the present embodiment, the thickness of the flexible substrate 2 in the bending region 3 is less than the thickness of the flexible substrate 2 in the non-bending region 4 by providing the first groove 12 on the flexible substrate 2 in the bending region 3. When the depth of the first groove 12 gradually decreases from the bending line 13 toward the direction perpendicular to the bending line 13 and away from the bending line 13, and the thickness of the flexible substrate 2 at the bending line 13 in the bending region 3 is the smallest. Since a bending radius at the bending line 13 is the smallest, the bending stress is the largest, and it is the easiest to break. Reducing the thickness of the flexible substrate 2 at the bending line 13 can effectively reduce the bending stress on the flexible substrate 2 at the bend line 13, and preventing the flexible substrate 2 from breaking.

In an embodiment, as shown in FIG. 1, the flexible substrate 2 positioned in the bending region 3 is bent to an angle of 180° in a direction away from the TFT array layer 5. The display panel 1 further includes a support layer 14, and the support layer 14 is positioned on a side of the flexible substrate 2 away from the TFT array layer 5. The flexible substrate 2 positioned in the first region 9 and the flexible substrate 2 positioned in the second region 10 are connected and fixed through the support layer 14 (including a backplate 15 and an adhesive layer 16). The first region 9 includes a display region 17 and a first transition region 18, the second region 10 includes a second transition region 20 and a third region 19, the display region 17 and the bending region 3 are connected through the first transition region 18, and the third region 19 and the bending region 3 are connected through the second transition region 20. The first transition region 18 corresponds to the second transition region 20, the third region 19 corresponds to the display region 17, and the TFT array layer 5, the organic light-emitting layer 6, and the support layer 14 are disposed corresponding to the display region 17.

Specifically, the first transition region 18, the second transition region 20, and the bending region 3 all belong to the non-display region. In the present embodiment, the support layer 14 is only disposed corresponding to the display region 17 so that after the bending region 3 is bent to an angle of 180°, a gap is formed between the flexible substrate 2 positioned in the first transition region 18, the bending region 3, and the second transition region 20 and the support layer, to make the flexible substrate 2 positioned in the first transition region 18, the bending region 3, and the second transition region 20 is not squeezed by the support layer 14. Thereby, the bending stress of the flexible substrate 2 positioned in the first transition region 18, the bending region 3, and the second transition region 20 is balanced, and the flexible substrate 2 cannot be completely bent or breaks after bending due to the uneven stress in the bending process.

Figure 6:
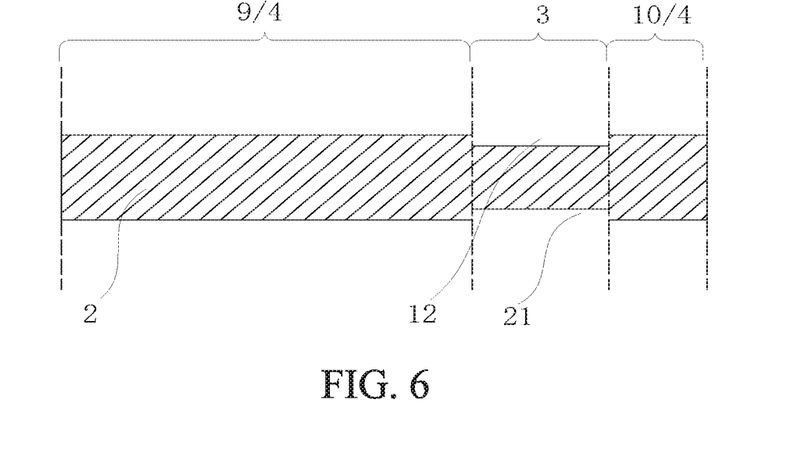
FIG. 6 is a cross-sectional view of yet another flexible substrate in the unbent state according to an embodiment of the present application.

As shown in FIG. 6, the present application further discloses an embodiment of a display panel 1, which is different from the abovementioned embodiment in that a first groove 12 is disposed on a surface of the flexible substrate 2, a second groove 21 is disposed on a surface of the flexible substrate 2 away from the first groove 12, and the first groove 12 and the second groove 21 are disposed corresponding to the bending region 3.

Specifically, when the flexible substrate 2 positioned in the bending region 3 is not bent, orthographic projections of the first groove 12 and the second groove 21 on the flexible substrate 2 coincide an orthographic projection of the bending region 3 on the flexible substrate 2, and the depth of the first groove 12 and the second groove 21 is same. Of course, the depth of the first groove 12 and the second groove 21 can be different. Here, the depth of the first groove 12 and the second groove 21 is not limited.

In the present embodiment, the first groove 12 and the second groove 21 are respectively disposed on both sides of the flexible substrate 2 in the bending region 3 to realize that a thickness of the flexible substrate 2 in the bending region 3 is less than a thickness of the flexible substrate 2 in the non-bending region. Moreover, a minimum curvature radius of the flexible substrate 2 in the bending region 3 is increased after bending, thereby reducing the bending stress on the flexible substrate 2 where has the minimum radius of curvature, thereby protecting the most easily broken part of the flexible substrate 2 in the bending region 3.

Figure 7:
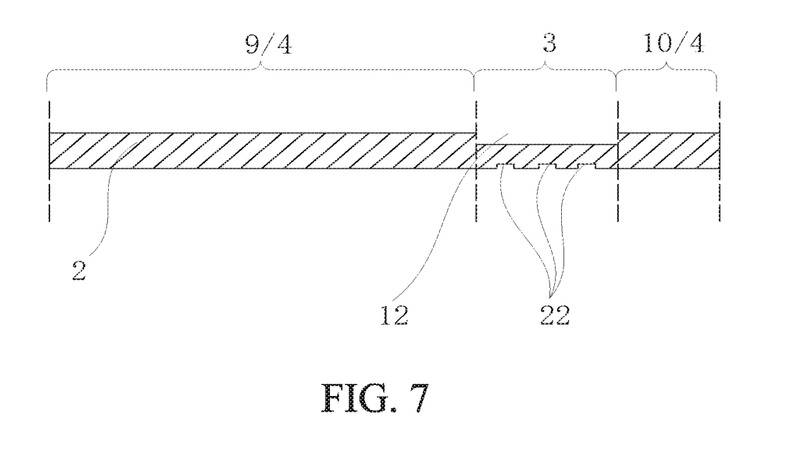
FIG. 7 is a cross-sectional view of yet another flexible substrate in the unbent state according to an embodiment of the present application.

As shown in FIG. 7, the present application further discloses an embodiment of a display panel 1, which is different from the abovementioned embodiment in that a first groove 12 is disposed on a surface of the flexible substrate 2, a plurality of third grooves 22 are disposed on a surface of the flexible substrate 2 away from the first groove 12, and the first grooves 12 and the plurality of third grooves 22 are disposed corresponding to the bending region 3.

Specifically, when the flexible substrate 2 positioned in the bending region 3 is not bent, an orthographic projection of the first groove 12 on the flexible substrate 2 coincides with an orthographic projection of the bending region 3 on the flexible substrate 2. The number of the third grooves 22 can be an odd number or an even number. A plurality of third grooves 22 are evenly distributed on the bending region 3.

In the present embodiment, a thickness of the flexible substrate 2 in the bending region 3 is less than a thickness of the flexible substrate 2 in the non-bending region 4 by providing a first groove 12 on the surface of the flexible substrate 2 in the bending region 3. At the same time, the third grooves 22 corresponding to the bending region 3 are disposed on the surface of the flexible substrate 2 away from the first groove 12. The evenly distributed third grooves 22 can disperse the bending stress on the surface of the flexible substrate 2 away from the first groove 12, which further reduces the bending stress on the flexible substrate 2 in the bending region 3 when it is bent.

Figure 8:
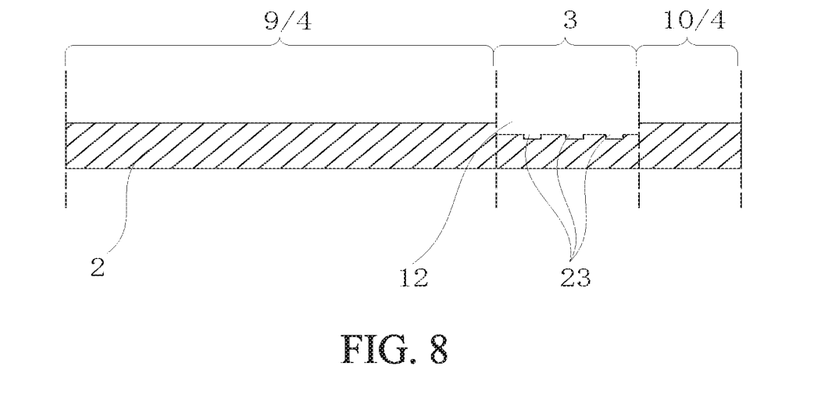
FIG. 8 is a cross-sectional view of yet another flexible substrate in the unbent state according to an embodiment of the present application.

As shown in FIG. 8, the present application further discloses an embodiment of a display panel 1, which is different from the abovementioned embodiments in that a first groove 12 is disposed on a surface of the flexible substrate 2, the first groove 12 is disposed corresponding to the bending region 3, and a plurality of fourth grooves 23 are disposed at a bottom of the first groove 12.

Specifically, the number of the fourth grooves 23 can be an odd number or an even number, and a plurality of the fourth grooves 23 are evenly distributed on the bottom of the first groove 12.

In the present embodiment, a thickness of the flexible substrate 2 in the bending region 3 is less than a thickness of the of the flexible substrate 2 in the non-bending region 4 by providing a first groove 12 on the flexible substrate 2 in the bending region 3. At the same time, the plurality of fourth grooves 23 are disposed at the bottom of the first groove 12, and the evenly distributed fourth grooves 23 can disperse the bending stress of the flexible substrate 2 where the first groove 12 is positioned. The bending stress on the flexible substrate 2 in the bending region 3 is further reduced during bending.

Figure 9:
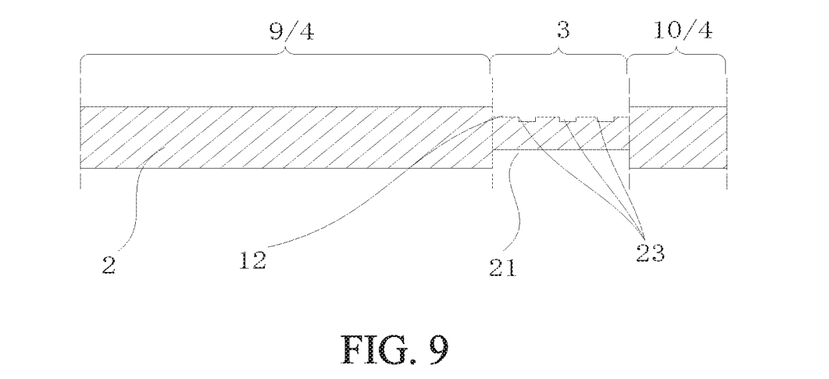
FIG. 9 is a cross-sectional view of yet another flexible substrate in the unbent state according to an embodiment of the present application.

As shown in FIG. 9, the present application further discloses an embodiment of a display panel 1, which is different from the abovementioned embodiment in that a first groove 12 is disposed on a surface of the flexible substrate 2, a second groove 21 is disposed on a surface of the flexible substrate 2 away from the first groove 12, the first groove 12 and the second groove 21 are disposed corresponding to the bending region 3, and a plurality of fourth grooves 23 are disposed at a bottom of the first groove 12.

Specifically, the number of the fourth grooves 23 can be an odd number or an even number, and the plurality of the fourth grooves 23 are evenly distributed on the bottom of the first groove 12.

In the present embodiment, the first substrate 12 and the second substrate 21 are respectively disposed on both sides of the flexible substrate 2 in the bending region 3 to realize that the thickness of the flexible substrate 2 in the bending region 3 is less than the thickness of the non-bending region. At the same time, the plurality of fourth grooves 23 are disposed at the bottom of the flexible substrate 2, and the evenly distributed fourth grooves 23 can further disperse the bending stress on the flexible substrate 2 where the first groove 12 is positioned. The bending stress on the flexible substrate 2 in the bending region 3 is further reduced during bending.

Figure 10:
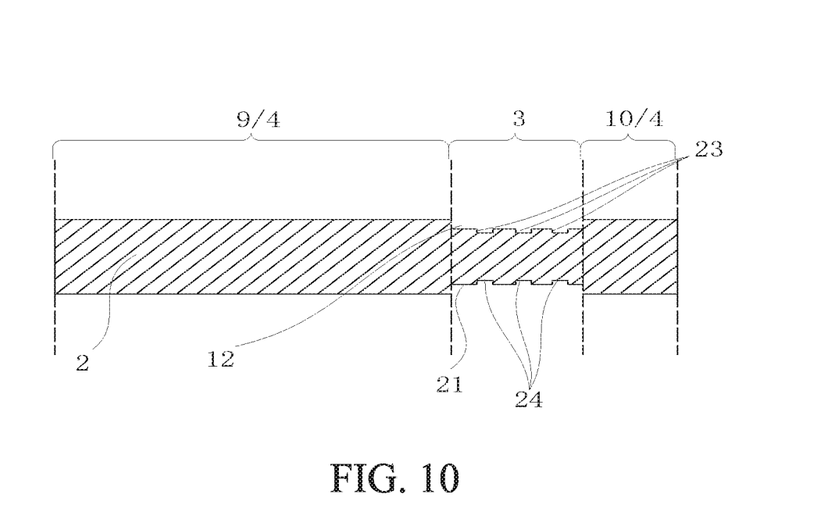
FIG. 10 is a cross-sectional view of yet another flexible substrate in the unbent state according to an embodiment of the present application.

As shown in FIG. 10, the present application further discloses an embodiment of a display panel 1. The difference from the abovementioned embodiment is that a first groove 12 is disposed on a surface of the flexible substrate 2, a second groove 21 is disposed on a surface of the flexible substrate 2 away from the first groove 12, the first groove 12 and the second groove 21 are disposed corresponding to the bending region 3, a plurality of fourth grooves 23 are disposed at a bottom of the first groove 12, and a plurality of fifth grooves 24 are disposed at a bottom of the second groove 21.

Specifically, the number of the fourth grooves 23 and the fifth grooves 24 can be odd or even. The fourth grooves 23 are evenly distributed on the bottom of the first groove 12, and the fifth grooves 24 are evenly distributed on the bottom of the second groove 21.

In the present embodiment, the first groove 12 and the second groove 21 are respectively disposed on both sides of the flexible substrate 2 in the bending region 3 to realize that a thickness of the flexible substrate 2 in the bending region 3 is less than a thickness of the in the non-bending region. At the same time, the plurality of the fourth grooves 23 are disposed at the bottom of the first groove 12, and the plurality of fifth grooves 24 are disposed at the bottom of the second groove 21. The evenly distributed fourth grooves 23 and the evenly distributed fifth grooves 24 respectively disperse the bending stress on the both sides of the flexible substrate 2 in the bending region 3. The bending stress on the flexible substrate 2 in the bending region 3 is further reduced during bending.

Figure 11:
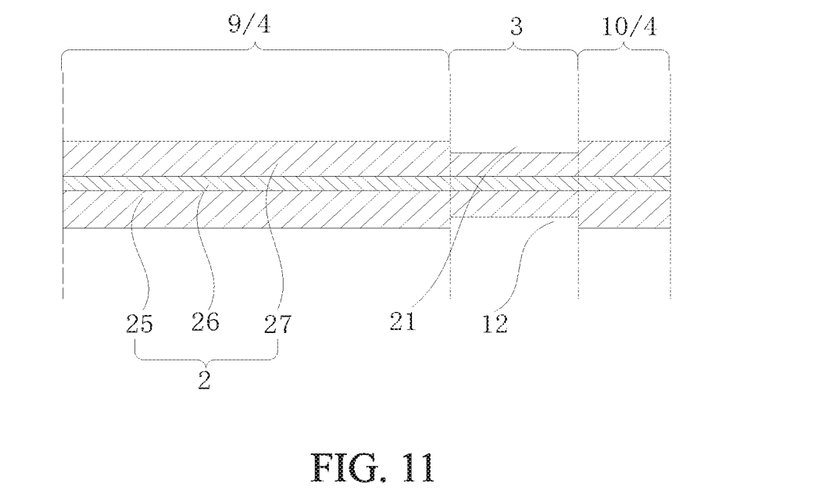
FIG. 11 is a cross-sectional view of yet another flexible substrate in the unbent state according to an embodiment of the present application.
Figure 12:
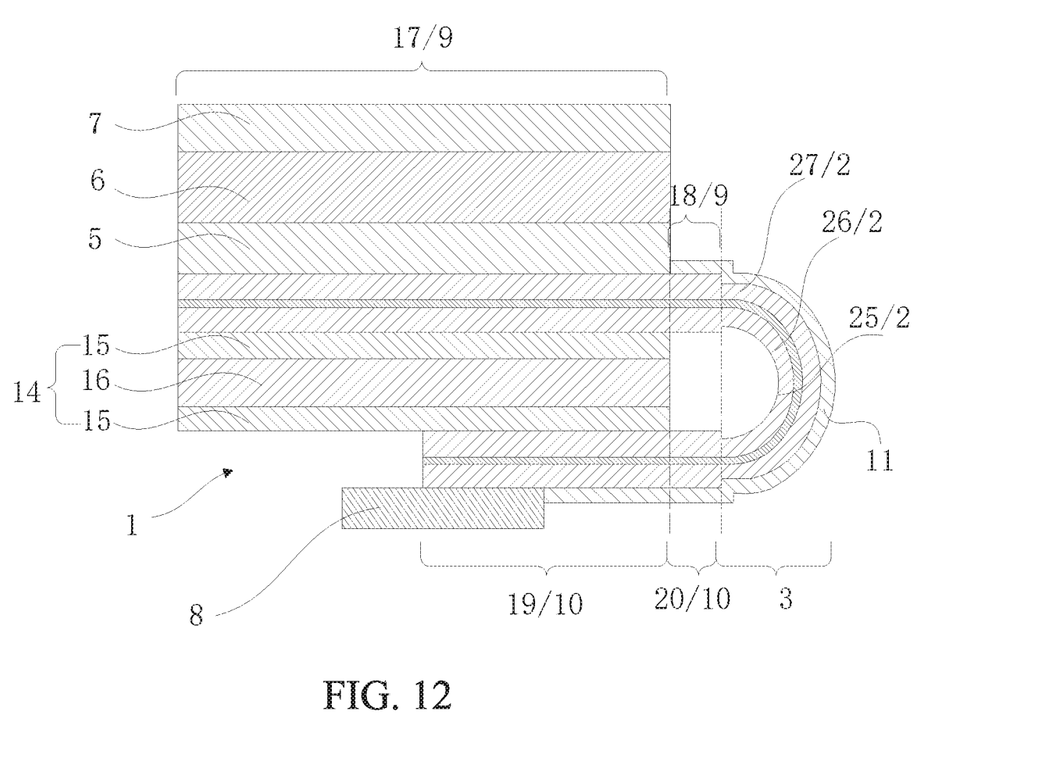
FIG. 12 is a schematic structural view of another display panel according to an embodiment of the present application.

As shown in FIG. 11 and FIG. 12, the present application further discloses an embodiment of a display panel 1. The difference from the abovementioned embodiment is that the flexible substrate 2 includes a first flexible layer 25, and an intermediate layer 26 and a second flexible layer 27 sequentially disposed on the first flexible layer 25. A first groove 12 is disposed on a surface of the first flexible layer 25 away from the intermediate layer 26, and a second groove 21 is disposed on a surface of the second flexible layer 27 away from the intermediate layer 26.

Specifically, the material of the first flexible layer 25 includes polyimide, the material of the second flexible layer 27 and the first flexible layer 25 are same, and the material of the intermediate layer 26 includes silicon oxide, silicon nitride, and a composite material of silicon oxide and silicon nitride, and so on. The intermediate layer 26 can play a role of blocking water and oxygen, also it can play a role of heat preservation to protect the flexible substrate 2 from being damage by the high temperature process.

Specifically, the depth of the first groove 12 and the second groove 21 is the same. Of course, the depth of the first groove 12 and the second groove 21 can also be different. Here, a thickness of the first groove 12 and the second groove 21 is not limited.

In the present embodiment, the flexible substrate 2 consists of the first flexible layer 25, and the intermediate layer 26 and the second flexible layer 27 sequentially disposed on the first flexible layer 25. By providing a first groove 12 on the first flexible layer 25 and a second groove 21 is disposed on the second flexible layer 27 to realize that the thickness of the flexible substrate 2 in the bending region 3 is less than the thickness of the flexible substrate 2 in the non-bending region 4. By reducing the thickness of the flexible substrate 2 in the non-bending region, which can reduce the bending stress of each layer of the structure in the bending region 3 in the bending process. The first flexible layer 25, the second flexible layer 27, and the intermediate layer 26 are prevented from being broken or the first flexible layer 25 and the second flexible layer 27 are respectively peeled from the intermediate layer 26 in the bending region 3, which ensures the structural integrity and functional integrity of the flexible substrate 2 and effectively improves the display effect of the display panel 1.

In particular, when the thickness of the first groove 12 and the second groove 21 is the same, the intermediate layer 26 is positioned on the neutral plane. In the bending process of the flexible substrate 2 in the bending region 3, the intermediate layer 26 suffered the minimum bending stress, which effectively protects the intermediate layer 26 from damage. Moreover, the first groove 12 and the second groove 21 also reduce the bending stress on the first flexible layer 25 and the second flexible layer 27 on both sides of the neutral plane in the bending region 3, so that the first flexible layer 25, the second flexible layer 27, and the intermediate layer 26 in the bending region 3 are prevented from breaking or peeling.

Figure 13:
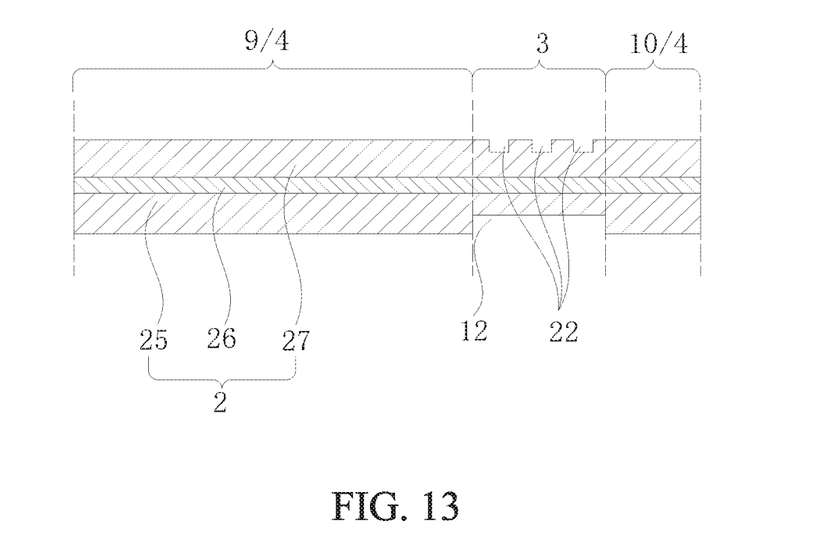
FIG. 13 is a cross-sectional view of yet another flexible substrate in the unbent state according to an embodiment of the present application.

As shown in FIG. 13, the present application further discloses an embodiment of a display panel 1. The difference from the abovementioned embodiments is that the flexible substrate 2 includes a first flexible layer 25, and an intermediate layer 26 and a second flexible layer 27 sequentially disposed on the first flexible layer 25; the first groove 12 is disposed on a surface of the first flexible layer 25 away from the intermediate layer 26, a plurality of third grooves 22 are disposed on the surface of the second flexible layer 27 away from the intermediate layer 26, and the third grooves 22 are disposed corresponding to the bending region 3.

Specifically, the number of the third grooves 22 can be odd or even, and the third grooves 22 are evenly distributed on the bending region 3.

In the present embodiment, by providing the first groove 12 on the first flexible layer 25 to realize that the thickness of the flexible substrate 2 in the bending region 3 is less than the thickness of the flexible substrate 2 in the non-bending region 4. By reducing the thickness of the flexible substrate 2 in the bending region 3, which can reduce the bending stress of each layer of the structure in the bending region 3 in the bending process. Moreover, the third grooves are evenly distributed on the second flexible layer 27, which can further reduce the bending stress of each layer structure in the bending region 3 in the bending process, and the first flexible layer 25, the second flexible layer 17, and the intermediate layer 26 in the bending region 3 are prevented from being broken or peeled. Thereby, ensuring the structural integrity and functional integrity of the flexible substrate 2 and effectively improving the display effect of the display panel 1.

Of course, a plurality of fourth grooves 23 can be further disposed at the bottom of the first groove 12, also a plurality of fifth grooves 24 can be disposed at the bottom of the second groove 21, which are not described herein again. In the abovementioned embodiment, the cross-sectional shapes of the first groove 12, the second groove 21, the third groove 22, the fourth groove 23, and the fifth groove 24 in a direction perpendicular to the flexible substrate 2 include a rectangle and an arc.

Figure 14:
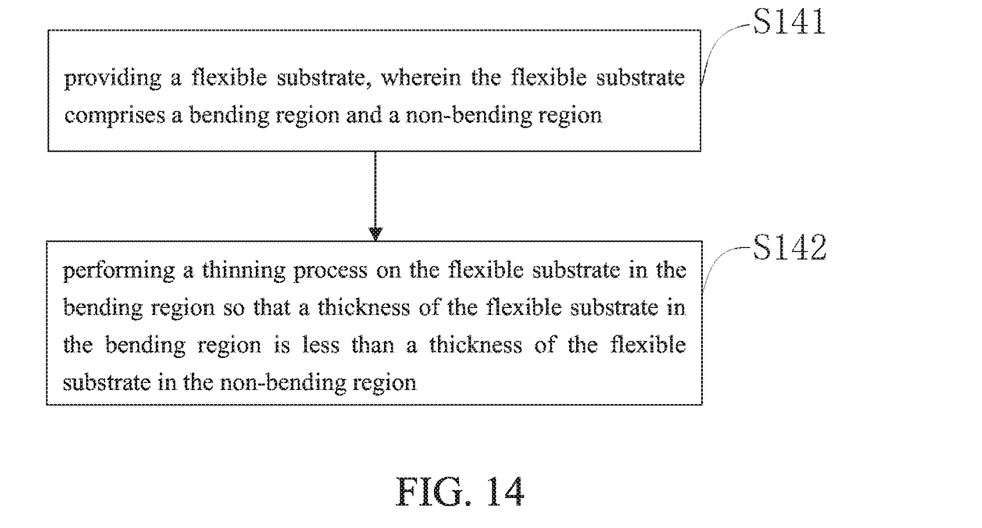
FIG. 14 is a schematic block diagram of a method of manufacturing a display panel according to an embodiment of the present application.

As shown in FIG. 14, an embodiment of the present application further provides a method of manufacturing a display panel 1, including the following steps:

S141, providing a flexible substrate, wherein the flexible substrate includes a bending region and a non-bending region; and S142, performing a thinning process on the flexible substrate in the bending region so that a thickness of the flexible substrate in the bending region is less than a thickness of the flexible substrate in the non-bending region.

Specifically, the step S142 includes the following steps.

Figure 15:
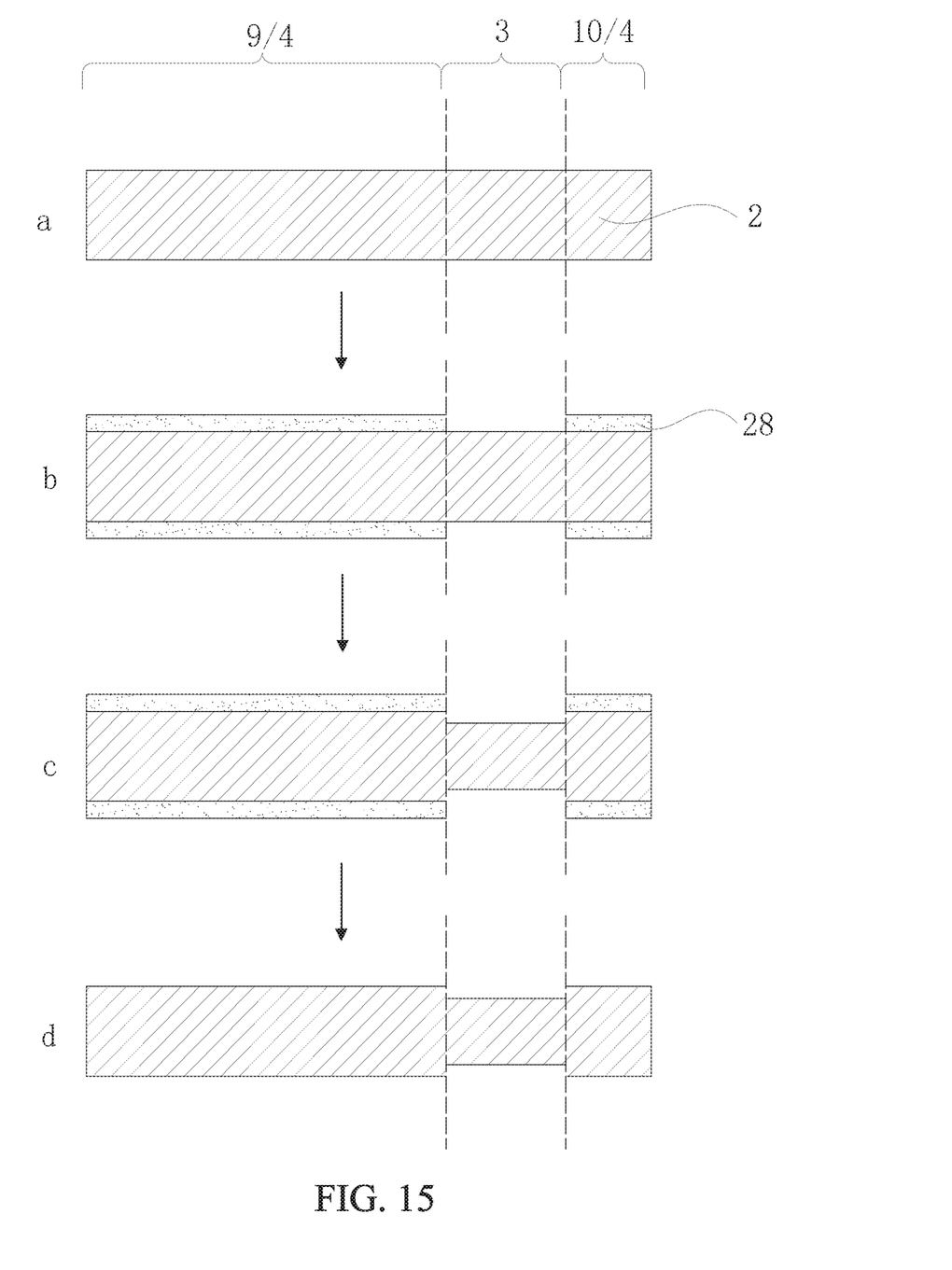
FIG. 15 is diagram showing a flowchart of a method of manufacturing a display panel according to an embodiment of the present application.

As shown in FIG. 15, a surface of the flexible substrate 2 (as shown by a in FIG. 15) in the non-bending region 4 is covered with a photoresist layer 28 to expose the flexible substrate 2 in the bending region 3 as shown by b in FIG. 15.

The exposed flexible substrate 2 is etched using an etching solution to thin the thickness of the flexible substrate 2 in the bending region 3, as shown by c in FIG. 15.

The photoresist layer 28 covered on the flexible substrate 2 is removed, as shown by d in FIG. 15.

Specifically, the thickness of the thinning can be controlled from nanometer to micrometer according to different processing processes.

Specifically, after thinning the flexible substrate 2 in the bending region 3, the TFT array layer 5, the organic light-emitting layer 6, the encapsulation layer 7, the driving circuit 8, and the support layer 14 will be formed on the flexible substrate 2, and the bending region 3 is bent. The specific steps are not described in detail here.

In the present embodiment, by reducing the thickness of the flexible substrate 2 in the bending region 3, the bending stress that the flexible substrate 2 in the bending region 3 undergoes during bending is reduced to avoid the flexible substrate 2 being broken or peeling from other adjacent structures in the bending process, thereby ensuring the overall performance of the display panel 1. In addition, the display panel 1 also includes a bending region 3 that coincides with the bending region 3 of the flexible substrate 2, reducing the thickness of the flexible substrate 2 in the bending region 3 as to reduce the thickness of the overall structure in the bending region 3 of the display panel 1. Compared to the scheme that by reducing a thickness of the metal layer 11 or the buffer layer in the bending region 3 of the display panel 1, and a thickness of the overall structure in the bending region of the display panel 1 can be reduced so as to reduce the stress on each layer structure in the bending region of display panel 1. The present application can significantly reduce the overall thickness of the bending region of the display panel 1 without damaging a structure of an effective display region 17 of the display panel 1, so that the bending stress on each layer structure positioned in the bending region 3 is reduced, and the flexible substrate 2 and other structural layers positioned in the bending region 3 are prevented from being broken or peeled, thereby improving the display effect of the display panel 1.

Figure 16:
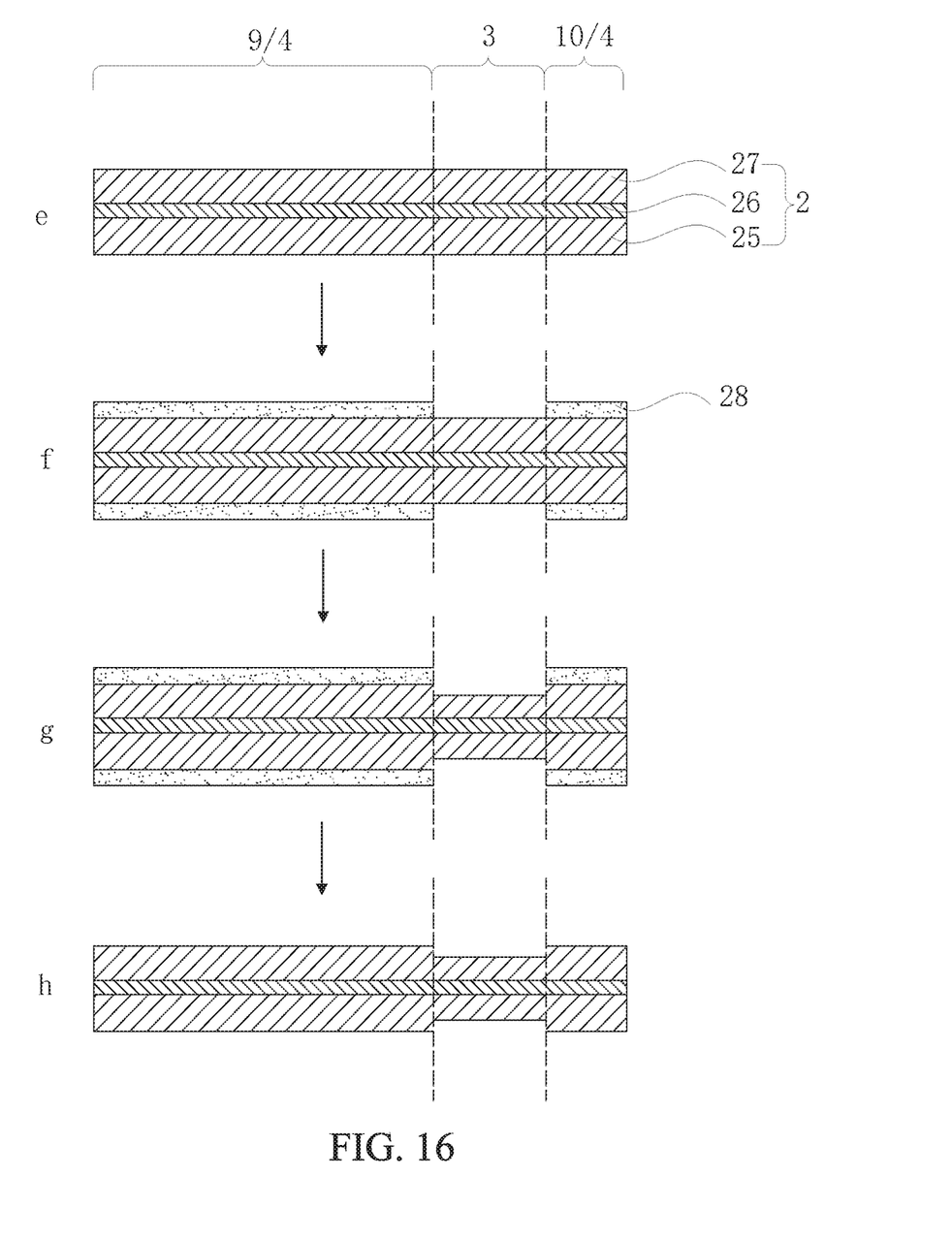
FIG. 16 is diagram showing a flowchart of another method of manufacturing a display panel according to an embodiment of the present application.

In an embodiment, as shown in FIG. 16, the flexible substrate 2 (as shown by e in FIG. 16) includes a first flexible layer 25, and an intermediate layer 26 and a second flexible layer 27 sequentially disposed on the first flexible layer 25. The step S142 includes the following steps.

The surfaces of the first flexible layer 25 and the second flexible layer 27 away from the intermediate layer 26 in the non-bending region 4 are covered with the photoresist layer 28 so that the first flexible layer 25 and the second flexible layer 27 in the bending region 3 are exposed, as shown by fin FIG. 16.

The exposed first flexible layer 25 and the second flexible layer 27 are etched using an etching solution to thin the thickness of the first flexible layer 25 and the second flexible layer 27 in the bending region 3, as shown by g in FIG. 16.

The photoresist layer 28 covered on the flexible substrate 2 is removed, as shown by h in FIG. 16.

In the present embodiment, the flexible substrate 2 consists of the first flexible layer 25, and the intermediate layer 26 and the second flexible layer 27 are sequentially disposed on the first flexible layer 25. By reducing the thicknesses of the first flexible layer 25 and the second flexible layer 27 in the bending region 3 to realize the thickness of the flexible substrate 2 in the bending region 3 is less than the thickness of the flexible substrate 2 in the non-bending region 4, which can reduce the bending stress of each layer of the structure in the bending region 3 in the bending process, and the first flexible layer 25 and the second flexible layer 17 are prevented from being broken or peeled from the intermediate layer 26 in the bending region 3. Thereby, ensuring the structural integrity and functional integrity of the flexible substrate 2 and effectively improving the display effect of the display panel 1.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising a flexible substrate, wherein the flexible substrate comprises a bending region and a non-bending region, and a thickness of the flexible substrate positioned in the bending region is less than a thickness of the flexible substrate positioned in the non-bending region;
    wherein a first groove is disposed on a surface of the flexible substrate, and the first groove is disposed corresponding to the bending region; and
    wherein a second groove is disposed on a surface of the flexible substrate opposite from the first groove, and the second groove is disposed corresponding to the bending region.

2. The display panel according to claim 1, wherein a plurality of third grooves are disposed on a surface of the flexible substrate away from the first groove, and the third grooves are disposed corresponding to the bending region.

3. The display panel according to claim 1, wherein a plurality of fourth grooves are disposed at a bottom of the first groove.

4. The display panel according to claim 1, wherein a plurality of fourth grooves are disposed at a bottom of the first groove, and a plurality of fifth grooves are disposed at a bottom of the second groove.

5. The display panel according to claim 1, wherein the flexible substrate comprises a first flexible layer, and an intermediate layer and a second flexible layer are sequentially disposed on the first flexible layer; and the first groove is disposed on a surface of the first flexible layer away from the intermediate layer, and the second groove is disposed on a surface of the second flexible layer away from the intermediate layer.

6. The display panel according to claim 5, wherein a plurality of fourth grooves are disposed at a bottom of the first groove, and a plurality of fifth grooves are disposed at a bottom of the second groove.

7. The display panel according to claim 1, wherein the non-bending region comprises a first region and a second region, and the first region and the second region are connected to each other by the bending region; wherein the display panel further comprises a thin film transistor (TFT) array layer, an organic light-emitting layer, and an encapsulation layer sequentially disposed on the flexible substrate positioned in the first region, a metal layer disposed on the flexible substrate positioned in the bending region, and a driving circuit disposed on the flexible substrate positioned in the second region; and wherein the metal layer extends from the TFT array layer to the driving circuit.

8. The display panel according to claim 7, wherein the flexible substrate positioned in the bending region is bent to an angle of 180° in a direction away from the TFT array layer; wherein the display panel further comprises a support layer, the support layer is positioned on a side of the flexible substrate away from the TFT array layer, and the flexible substrate positioned in the first region and the flexible substrate positioned in the second region are connected and fixed by the support layer.

9. The display panel according to claim 8, wherein the first region comprises a display region and a first transition region, and the second region comprises a second transition region and a third region; wherein the display region and the bending region are connected through the first transition region, the third region and the bending region are connected through the second transition region; the first transition region corresponds to the second transition region, the third region corresponds to the display region; and the TFT array layer, the organic light-emitting layer, and the support layer are disposed corresponding to the display region.

10. A method of manufacturing a display panel, comprising the following steps:

providing a flexible substrate, wherein the flexible substrate comprises a bending region and a non-bending region; and performing a thinning process on the flexible substrate in the bending region so that a thickness of the flexible substrate in the bending region is less than a thickness of the flexible substrate in the non-bending region;

wherein the flexible substrate comprises a first flexible layer, and an intermediate layer and a second flexible layer are sequentially disposed on the first flexible layer;

wherein performing a thinning process on the flexible substrate in the bending region comprises the following steps:

covering the first flexible layer and a surface of a side of the second flexible layer away from the intermediate layer in the non-bending region with a photoresist layer to expose the first flexible layer and the second flexible layer in the bending region;

etching exposed the first flexible layer and the second flexible layer by an etching solution to thin thicknesses of the first flexible layer and the second flexible layer in the bending region; and removing the photoresist layer covered on the flexible substrate.

11. The method of manufacturing the display panel according to claim 10, wherein performing a thinning process on the flexible substrate in the bending region comprises the following steps:

covering a surface of the flexible substrate in the non-bending region with a photoresist layer to expose the flexible substrate in the bending region;

etching the exposed flexible substrate by an etching solution to thin the thickness of the flexible substrate in the bending region; and removing the photoresist layer covered on the flexible substrate.

* * * * *